Nov. 3, 1964 H. F. SCHELLACK 3,155,767

CONNECTING ARRANGEMENT IN ELECTRONIC MODULAR STRUCTURES

Filed Jan. 30, 1962 3 Sheets-Sheet 1

INVENTOR.
HARRY F. SCHELLACK
BY Morris A. Rabkin
ATTORNEY

Nov. 3, 1964 H. F. SCHELLACK 3,155,767

CONNECTING ARRANGEMENT IN ELECTRONIC MODULAR STRUCTURES

Filed Jan. 30, 1962 3 Sheets-Sheet 2

INVENTOR.
HARRY F. SCHELLACK
BY
Morris Rabkin
ATTORNEY

Nov. 3, 1964 H. F. SCHELLACK 3,155,767

CONNECTING ARRANGEMENT IN ELECTRONIC MODULAR STRUCTURES

Filed Jan. 30, 1962

3 Sheets-Sheet 3

INVENTOR.
HARRY F. SCHELLACK
BY Morris Robbin
ATTORNEY 3,155,767

CONNECTING ARRANGEMENT IN ELECTRONIC MODULAR STRUCTURES

Harry F. Schellack, Belleville, N.J., assignor to Radio Corporation of America, a corporation of Delaware Filed Jan. 30, 1962, Ser. No. 169,720
8 Claims. (Cl. 174—68.5)

Figure 1:
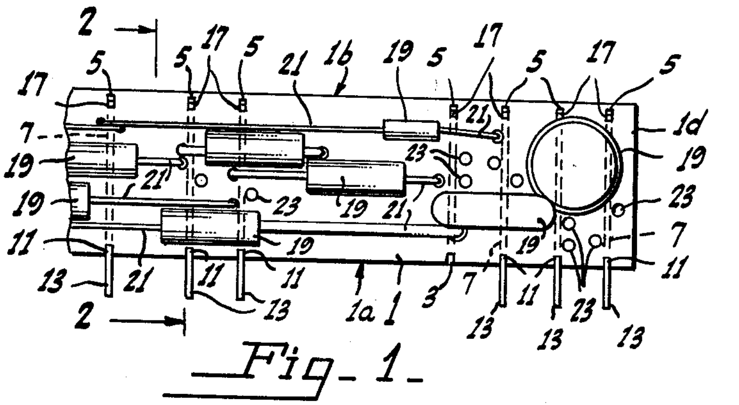

This invention relates to electronic modular structures, and more particularly to panel type modules for mounting electronic components in closely packed relation and for facilitating electrical and mechanical connection thereof to other modules and/or components, or to external circuits.

In modern electronic equipments, it is becoming increasingly important to reduce weight and size of the components. For example, in aircraft, missiles, satellites, ships, submarines, etc., high penalties are imposed on weight and physical size of electronic equipment used therein. In certain other areas where portability and ease of transportation are vital factors, these can be attained most feasibly when electronic components or units of small size and weight are available. In other cases, as in high speed, electronic data processing equipment where signal transit time requirements may largely determine the physical size of the equipment, size and weight may again be vital factors. Also, from a maintenance and servicing standpoint, the use of easily replaceable, small components is often a great advantage. With the foregoing in mind, the trend has been toward small, modular structures, since these make possible close packaging, in small units, of electronic components.

Various forms of modular structures have been proposed heretofore. Among these have been printed circuit panels on which components are mounted for connection to the printed circuit conductors which must be laid out according to prescribed patterns. Printed circuit panels are not only expensive to produce, especially if cross-overs are to be avoided (thereby often necessitating complicated circuit pattern arrangements), but they are, in most cases, quite frangible and, therefore, easily subject to breakage. Hence, considerable care must be exercised in handling panel modules of this type.

The primary object of the present invention is to provide improved electronic modular structures which are relatively small in size and light in weight, considering the components which they may incorporate, and which readily lend themselves to close packaging.

More particularly, it is an object of the present invention to provide improved electronic modular structures in the nature of either modules or sub-modules wherein connections between a complex or plurality of individual electronic components can be readily effected, and which incorporate means for ready connection thereof to other modules and/or components, as well as to external circuits.

Another object of the present invention is to provide improved electronic modular structures which lend themselves to close packing of components.

Still another object of the invention is to provide improved modular structures as aforesaid wherein the components and the leads therefrom are well insulated from each other electrically notwithstanding the close component packaging.

Yet another object of the present invention is to provide improved electronic modular structures in which the problem of cross-over of leads is minimized.

A further object of this invention is to provide improved modular structures as above set forth which lend themselves to efficient cooling and heat dissipation.

A still further object of the invention is to provide improved electronic modular structures which are suitable for use as plug-in units whereby they can be connected to, or removed from, other circuit units with great facility.

Yet another object of the present invention is to provide improved modular units of the type set forth which are easy to fabricate and assemble, and which can be serviced with great ease.

It is also an object of this invention to provide improved electronic modular structures as aforesaid which are simple, yet very sturdy, in construction; which are highly reliable in operation; and which are economical in cost, especially when considered in relation to printed circuit type of modules which have been proposed heretofore.

Briefly stated, one form of modular structure according to this invention comprises an electrical insulating board or panel across one face of which a plurality of spaced bus members are mounted. On the opposite face of the board or panel a plurality of components are disposed. These components have leads which extend through holes or openings in the board at strategically located points thereon. The component leads extending through the aforesaid holes are bent over onto appropriate ones of the bus members and are soldered thereto. The soldering of all connections can be accomplished in a single dip soldering operation after all the leads have been bent over onto their respective bus members. The bus members extend beyond one edge of the board and serve as pin connections for plugging the modular unit into similar modular units or into appropriate electrical connectors, or as terminals for connection thereto of leads from external circuits. In any case, not only can the individual components be packed closely on their respective boards, but the modular units with their attached, closely packed components can also be mounted in closely packed relation on one or more other such modular units or on suitable connectors. Notwithstanding such close packing, cooling can be accomplished effectively by passing cooling air along or past such units without any difficulty. Moreover, since the individual components are mounted on one surface of the insulating boards, the leads therefrom can be passed through judiciously selected holes in the boards without causing them to cross any other leads or any but the desired bus members. Thus, the problem of cross-over of conductive leads is substantially avoided.

Figure 3:
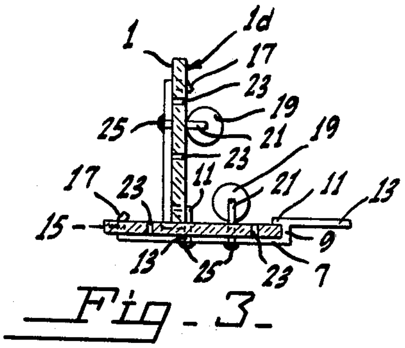
Figure 2:
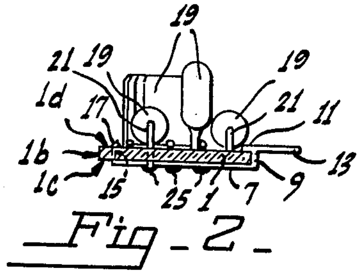
Figure 10:
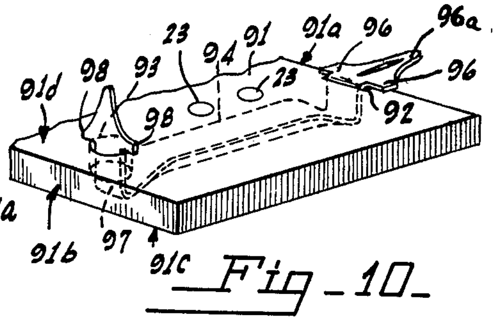
Figures 9, 11:
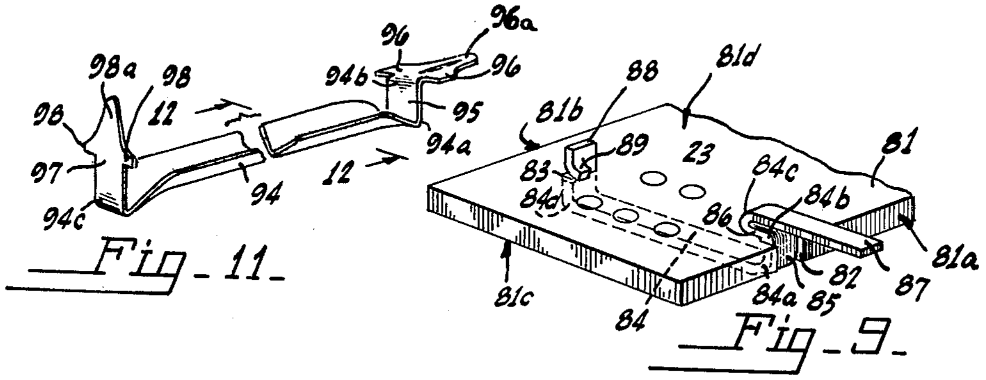
Figure 12:
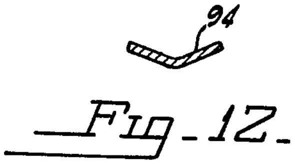

The novel features of the invention, both as to its organization and manner of use, as well as additional objects and advantages thereof, will be understood more readily from the following description, when read in connection with the accompanying drawings in which FIGURE 1 is a fragmentary, top plan view of one form of modular structure according to the present invention, FIGURE 2 is a transverse sectional view thereof taken along the line 2—2 of FIG. 1, FIGURE 3 is a transverse sectional view similar to FIG. 2 and showing two modular units of the type shown in FIGS. 1 and 2 connected to each other at a right angle, FIGURES 4 to 10, inclusive, are all relatively enlarged, fragmentary, perspective views of modular units similar to that of FIG. 1 but each showing a different form of bus member mounted on the insulating board or panel, FIGURE 11 is a perspective view of the bus member of FIG. 10, FIGURE 12 is a sectional view taken on the line 12—12 of FIG. 11, and FIGURES 13, 14 and 15 are somewhat enlarged, transverse sectional views similar to FIG. 2 but showing other forms of modular units according to the instant invention.

Referring more partcicularly to the drawings, there is shown, in FIGURES 1 and 2, a modular structure comprising an elongated, electronic component supporting panel or board 1 of insulating material having opposed, longitudinal edges 1a and 1b, and opposite surfaces 1c and 1d. Along the edge 1a of the board, a plurality of spaced notches 3 are punched out; and in transverse alignment with each notch 3, an opening 5 is punched out adjacent to the edge 1b. Extending transversely across the board surface 1c in longitudinally spaced relation along the board and in engagement with the surface 1c are a plurality of conductive bus bars 7. One such bus bar has been omitted from FIGURE 1 to show the structure of the board 1 more clearly. As can also be seen in FIGURE 1, the bus bars 7 shown on the board 1 are arranged parallel to each other and at a right angle to the edges 1a and 1b of the board. It should be understood, however, that this arrangement is merely for the purpose of illustration since the bus bars 7 can be disposed in any other desired arrangement.

Each bus bar 7 has a portion 9 which is received in one of the notches 3 and which terminates in a tongue 11 that bears against the board surface 1d. The tongue 11 also has a portion which extends beyond the edge 1a of the board to provide a protruding terminal element 13 for a purpose shortly to be set forth. Each bus bar 7 also has a portion 15 which extends through the correspondingly aligned opening 5 and beyond the board surface 1d, the portion 15 terminating in a tongue or anchoring element 17 that is bent over onto the board surface 1d. In this way, each bus bar 7 is anchored firmly to the board 1. To accomplish this, the bus bars are first set up in an appropriate fixture in properly spaced, parallel relation to each other. The board 1, disposed so that its notches 3 are aligned with the respective bus bar portion 9, is then slipped in under the tongues 11 whereupon the bus bar portions 9 will be received in their respective notches 3. The anchoring tongues 17 are then pressed forwardly somewhat and down against the board surface 1d to thereby firmly secure the bus bars to the board.

Disposed on or closely adjacent to the board surface 1d are one or more electronic components 19, such as resistors, capacitors, inductors, diodes, transistors and the like, all having at least two leads 21. These components form elements of either a complete circuit or a circuit network when they are properly interconnected. Connection between various of the components 19 to each other and to external circuits, circuit networks, or other modular units and/or components is effected by means of the various bus bars 7. To this end, the board 1 is formed with a plurality of openings or holes 23 which extend therethrough from one to the other of its surfaces 1c and 1d in proximity to one or another of the various bus bars 7. The leads 21 are bent to extend down through judiciously selected openings from the surface 1d and past the opposite surface 1c of the board 1, the leads then being bent again over into engagement with appropriate pairs of the bus bars for each component. The selection of particular holes 23 for any of the component leads is made on the basis that no lead 21 will have to cross any bus bar 7 along the board surface 1c other than that to which it is to be connected. Thus, the problem of cross-overs is minimized, if not entirely avoided. In some cases, a given one of the openings 23 may receive more than one lead 21, depending upon the arrangement of components on the board and the circuit connections to be effected. In any case, after all the desired connections have been made, the connected parts are soldered together with solder joints 25, as by known dip soldering methods which can solder all connections concurrently. In the interest of assuring the shortest feasible leads, the openings or holes 23 are provided and the bus bars 7 are applied at strategically located points on the board 1.

The boards 1 may, if desired, be formed of a fairly pliable plastic material so that they can give appreciably, if bent, without cracking or breaking. On the other hand, the bus bars 7 are preferably formed of fairly rigid metal. Thus, the bus bars 7 act as struts which reinforce the boards to further protect them against facile breaking and to provide sturdy modular structures. At the same time, since the bars 7 are quite rigid, their terminal portions 13 act as sturdy terminal pins for connection of a modular structure such as heretofore described to other similar modules, or to suitable electrical connectors, or directly to external circuits. For example, a modular unit such as described above can be "plugged into" another such unit with the boards of the units at a right angle to each other by inserting the terminal pins 13 of one unit into appropriately located holes or openings 23 of the other one, as illustrated in FIGURE 3. Here, the terminal elements or pins 13 of the vertical unit are plugged into openings 23 in the horizontal one and are bent over onto, and soldered to, adjacent bus bars 7 on the horizontal unit. In this way, the components 21 of the two units are appropriately interconnected. Depending on the size of the boards, several vertical modular units, for example, arranged in suitably spaced, parallel relation, may be plugged into a horizontal unit and joined thereto by solder joints 25 as above described. In modular structures and combinations thereof such as described, both the components 19 on any board 1 and the various boards 1 in relation to each other can be packed closely to provide closely packaged, compact, modular structures of small size and weight. At the same time, and in spite of such close packing, cooling air can be forced along and past the components and boards of each unit to readily dissipate heat developed by the components during operation.

Instead of plugging one or more modular units into another as described above, such units can be plugged into any one of a variety of suitable female or socket type of connectors available on the market, the terminal elements or pins 13 acting as the male elements. In turn, the contacts customarily present in such socket connectors can be connected to external circuits. However, if desired, instead of employing socket connectors between the modular units and the external circuits, modular units according to the present invention can be connected directly to such external circuits, as by wire wrapping around the terminal elements 13, in well known manner, leads from such circuits.

Figure 4:
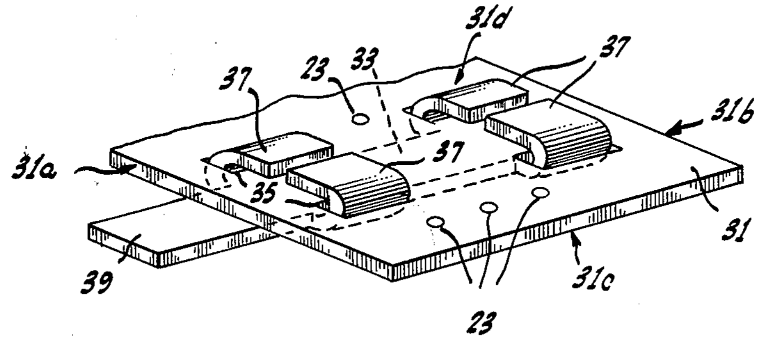

In FIGURE 4 is shown a modular insulating board 31 having a different form of conductive bus bar 33 thereon. Here, the board 31 is provided with two pairs of transversely aligned slots or openings 35 therethrough in proximity to the opposed edges 31a and 31b thereof. The bus bar 33 is provided with two pairs of laterally extending tabs 37 which are inserted through the respective slots 35 after first being bent 90° into parallel relation with each other. With the bus bar 33 thereby disposed transversely across the board 31 against the surface 31c thereof, the tabs 37 are then bent toward each other and pressed firmly against the surface 31d of the board while the bus bar is held against the surface 31c to thereby anchor the bus bar to the board. Openings 23, as in FIGURE 1, receive one or more component leads inserted from the surface 31d for connection to the bus bar 33 adjacent the surface 31c by solder or in any other suitable way. The bus bar 33 has a portion 39 which extends beyond the board edge 31a to provide a protruding terminal element for connection to external circuit means in any of the ways set forth above in connection with the terminal pins 13. Any desired number of bus bars 33 can be mounted on the board 33 either in parallel relation or in any other suitable relation.

Figure 5:
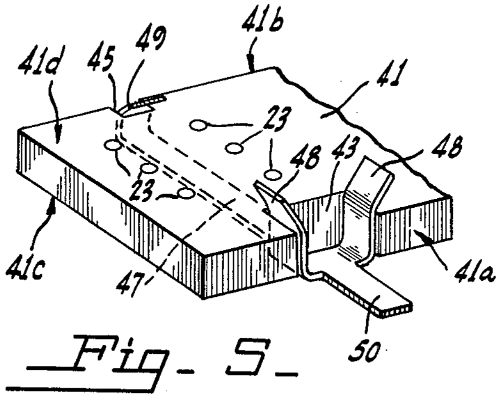

In the form of the invention shown in FIGURE 5, the insulating board 41 is formed with a relatively wide notch 43 in its edge 41*a* and a relatively narrow notch 45 in its edge 41*b* in transverse alignment with the notch 43. A conductive bar 47, disposed against the board surface 41*c* transversely thereacross, has a pair of lateral tabs 48 which are disposed in the notch 43. To mount the bus bar 47 on the board 41, the tabs 48 are bent up 90° into parallel relation and inserted into the notch 43, after which the tabs are again bent away from each other and down onto the board surface 41*d* while the bus bar 47 is held firmly against the board surface 41*c*. The end portion 49 of the bus bar 47 which is remote from the tabs 48 is then bent up into the notch 45 and then down again against the surface 41*d* to thereby firmly secure the bus bar 47 to the board 41. Once again, the bus bar 47 extends beyond its tabs 48 and the edge 41*a* of the board 41 to provide a protruding terminal element 50 adapted for connection to external circuit means. It will be apparent that as many bus bars 47 as may be necessary can be mounted on the board 41 in suitably spaced relation, the board being provided with holes 23 in proximity to the various bus bars for reception therethrough of component leads to be connected to selected pairs of the various bus bars.

Figure 6:
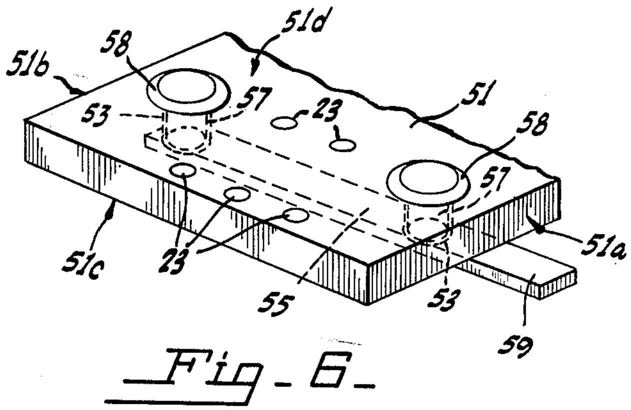

In FIGURE 6, the insulating board 51 of the modular structure is formed with a pair of transversely spaced openings 53 therethrough in proximity to its opposite edges 51*a* and 51*b*. A conductive bus bar 55 has a pair of rivets 57 thereon which extend thorugh the openings 53 from the surface 51*c* of the board somewhat beyond the surface 51*d* thereof. With the bus bar 55 held firmly against the board surface 51*a* transversely thereacross, the ends of the rivets 57 beyond the surface 51*d* are then expanded to provide heads 58 which engage the surface 51*d* to firmly anchor the bus bar 55 to the board 51. Any desired number of such bus bars may, of course, be secured to the board 51 in whatever arrangement and spacing is desired, each of the bus bars 55 having a portion 59 which extends beyond the adjacent rivet 57 and the edge 51*a* of the board 51 to provide a protruding terminal element for the structure. The openings 23 in the board 51 are for the same purpose as heretofore described.

Figure 7:
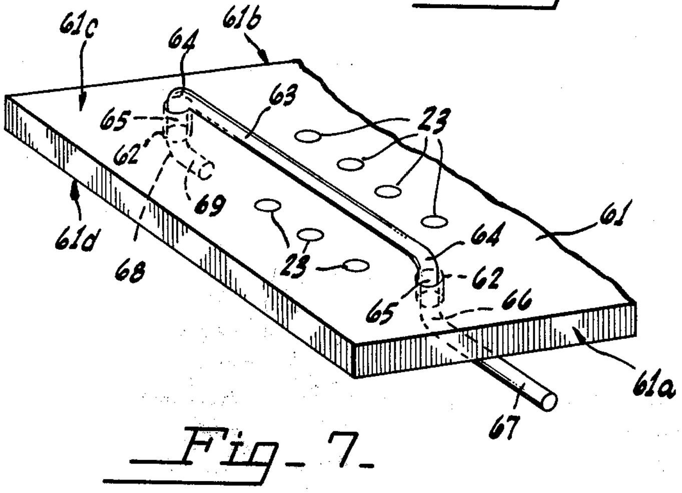

The insulating board 61 of FIGURE 7 is similar to that of FIGURE 6 in that, in addition to the holes 23, it is provided with a pair of transversely spaced openings 62 therethrough in proximity to its edges 61*a* and 61*b*. A conductive bus member 62 of wire, for example, has its main portion extending transversely across and disposed against the board surface 61*c* and has two 90° bends 64 therein to provide portions 65 which extend through the openings 62. One of the portions 65 is then again formed with a bend 66 to provide a portion 67 which bears against the board surface 61*d* and extends beyond the edge 61*a* thereof to provide a protruding terminal element. The other bus member portion 65 is formed with a bend 68 in the same direction as the bend 66 to provide a second anchoring portion 69 which also bears against the board surface 61*d*. Thus, a bus member 63 of uncinated (hooked) form is securely anchored to the board 61. As many such bus members as may be desired can be readily secured to the board in suitably spaced arrangement.

Figure 8:
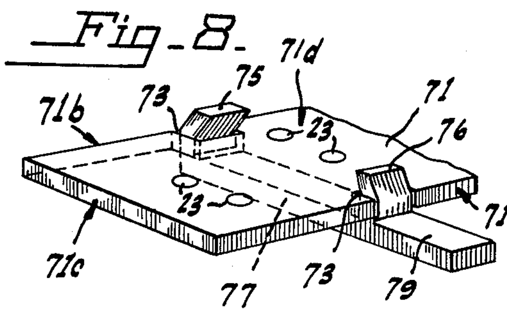

FIGURE 8 shows a modular structure the insulating board 71 of which has transversely aligned notches 73 in the opposed edges 71*a* and 71*b* thereof. Into these notches fit a pair of upstanding anchoring tongues or tabs 75 and 76 of a conductive bus bar 77 which extends transversely across the board 71 in engagement with the surface 71*c* thereof. The tabs 75 and 76 both extend beyond the surface 71*d* of the board 71. When they are bent toward each other and over against the board surface 71*d* in a manner similar to the anchoring element 17 of FIGURE 1, the tabs secure the bus bar to the board. As with the previously described bus bars, the bar 77 has a portion 79 which extends beyond the tab 76 and board edge 71*a* to provide a protruding terminal element. With a desired multiplicity of bus bars 77 mounted on the board 71 and a plurality of components on the board whose leads are brought down through the openings 23 for connection to selected such bus bars, a modular structure is provided for use in the manner previously set forth.

In FIGURE 9, there is shown an insulating board 81 which, like that of FIGURE 1, has a notch 82 in its edge 81*a* and a slot or opening 83 adjacent the opposite edge 81*b* thereof, the notch 82 and the opening 83 being transversely aligned. As before, a conductive bus bar 84 engages the board surface 81*c* and extends across it. The bus 84 has, at a point intermediate its length, a first 90° bend 84*a* to provide a portion 85 which fits into the ntoch 82, a second 90° bend 84*b* to provide an anchoring portion 86 which bears against the board surface 81*d*, and then a reverse bend 84*c* to provide a terminal portion 87 which extends beyond the anchoring portion 86 and beyond the edge 81*a* of the board. Near its other end, the bus bar 84 has another 90° bend 84*d* to provide a portion 88 which extends up beyond the board surface 81*d* where the portion 88 is upset, as by a lance 89 which engages the surface 81*d*, to thereby anchor or secure the bus bar in place. It will be apparent that a number of bus bars 84 can be mounted on the board 81 in desired, longitudinally spaced relation therealong.

In the form of the invention shown in FIGURES 10, 11 and 12, the insulating board 91 is also formed with a notch 92 along its edge 91*a* and a transversely aligned, relatively large, circular opening 93 therethrough adjacent to the opposite edge 91*b* thereof. A conductive bus bar 94 of resilient metal has a body portion which engages the surface 91*c* of the board and may be V-shaped in cross section, as shown in FIGURE 12, or formed with a longitudinal rib, to stiffen that portion. Near one end, the bar 94 has a first 90° bend 94*a* to provide a portion a portion 95 which is disposed in the notch 92. At the end of the portion 95, the bus bar has a second 90° bend 94*b* adjacent to which the bar 94 has a pair of laterally extending ears 96 that engage the surface 91*d* of the board. Beyond the ears 96, the bus bar has a portion 96*a* which is preferably also stiffened by a V-crease or a rib, and which extends beyond the board edge 91*a* to provide a protruding terminal element. Near its other end, the bus bar 94 has another 90° bend 94*c* to provide a portion 97 that has a pair of laterally extending ears 98 and preferably, but not necessarily, terminates in a tapered end portion 98*a*. After the portion 95 is in the notch 92 and the ears 96 have been applied to the surface 91*d*, the opposite end of the bus bar is pushed into the opening 93. Entry of the end portion 98*a* of the bus bar into the opening 93 is facilitated if the portion 98*a* is tapered as shown. In any case, since the bus bar is transversely resilient at the ears 98, these ears will conform to the curvature of the opening 93 while passing therethrough. However, as soon as the ears 98 have passed completely through the opening 93, they will spring or snap back to their original position and will engage the surface 91*d* of the board. In this way, the bus bar 94 becomes anchored to the board 91 and is held firmly thereon. With a plurality of such bus bars 94 mounted in place on the board 91 in suitably spaced relation therealong, the desired number and types of components can be applied to the board surface 91*d* and their leads inserted through appropriate openings 23 for connection to selected pairs of the bus bars.

Figure 13:
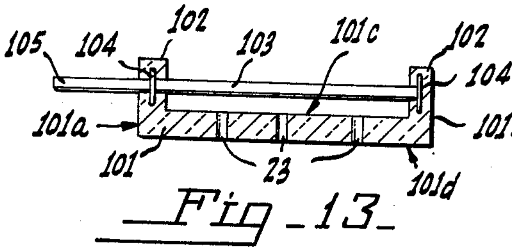

The insulating board 101 of FIGURE 13 is formed by molding from a suitable plastic material and has a pair of opposed flanges 102 along its opposed, longitudinal edges 101*a* and 101*b*. A plurality of bus bars 103 extend transversely across the board surface 101*c* in slightly spaced relation thereto and in longitudinally spaced relation along the board 101. Each bus bar 103 has a pair of enlarged portions 104 embedded or otherwise confined in the flanges 102, preferably by molding in situ during molding of the board 101 to thereby anchor the bus bars to the board. Each bus bar also has an integral portion 105 extending beyond one of the flanges 102 to provide a protruding terminal element for the modular structure. Openings 23 in the board 101 serve, as before, to receive therein leads from electronic components mounted on or adjacent to the board surface 101*d*, so that such leads can be connected to appropriate pairs of bus bars 103.

Figure 14:
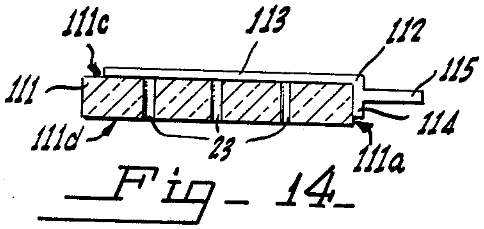

The insulating board 111 of FIGURE 14 has affixed thereto, by means of suitable cement or other adhesive, a plurality of generally L-shaped, conductive bus bars 112. The long arm 113 of each L is applied to and transversely across the surface 111*c* of the board, and the short arm 114 of the L is applied to the edge 111*a* of the board. The bus bar also has an integral portion 115 which extends from the short arm 114 beyond the board edge 111*a* to provide a protruding terminal element for the purposes heretofore indicated. Components on the surface 111*d* of the board can have their leads connected to various pairs of bus bars 112 on the board by extending such leads through selected openings 23.

Figure 15:
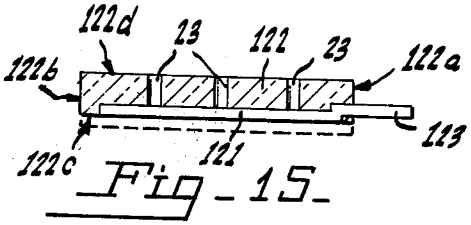

The modular structure of FIGURE 15 is also made by molding in situ a plurality of conductive bus bars 121 in a board 122 of insulating material in longitudinally spaced relation along the board and extending transversely thereacross between the opposite board edges 122*a* and 122*b*. By such molding, each bus bar becomes embedded in the board. After the assembly has been molded, the portion of the board 122 denoted by the dotted lines is ground off to expose the bus bars 122 flush with the surface 122*c* of the board. Leads extending from components mounted on or adjacent to the board surface 122*d* and inserted through selected openings 23 in the board can then be soldered to appropriate pairs of the thus exposed bus bars. Each bus bar has a portion 123 extending beyond the board edge 122*a* to provide, as in the earlier described forms of the invention, a protruding terminal element for the modular structure by means of which connection can be made to external circuit means.

From the foregoing description, it will be apparent that, by the present invention, there have been provided improved electronic modular structures which are of compact design, small size and light weight, and which lend themselves to close packing. Notwithstanding the close packing, however, such modules can be cooled easily and efficiently. Moreover, in modules such as described herein, the module boards can have electronic components mounted thereon in an endless variety of arrays, with minimum problems of cross-over of leads or conductors, to provide almost any desired electronic circuit. In addition, by the use of bus bars having projecting terminal elements, each bus bar can be employed not only to provide connection between various components on the board, but also as a connector for connection of the modules to external circuits. Modular structures according to the present invention are highly reliable and efficient in operation, and yet, if necessary, they can be serviced easily for removal and/or replacement of any such module, either in whole or in part, or for replacement of any component thereon which may become faulty.

Although a number of modifications of the invention have been described herein, these are merely for the purpose of illustration. Undoubtedly, other forms of the invention, as well as variations in those described, all coming within the spirit of the present invention, will suggest themselves to those skilled in the art. Hence, it is intended that the foregoing shall be considered merely as illustrative and not in a limiting sense.

I claim:

1. In an electronic modular structure, a supporting board of insulating material, and a pair of conductive bus members mounted on said board along one surface thereof between opposed edges thereof, said bus members being secured to said board at least at points in proximity to said edges and extending beyond one of said edges to provide protruding terminal elements, said board having a pair of openings therethrough spaced laterally from but in proximity to said bus members and extending from said one surface to the opposite surface thereof in predetermined relation to said bus members, said board being adapted to receive on its said opposite surface an electronic component having a pair of leads capable of extending through said openings for electrical connection, respectively, to said bus members, and said protruding terminal elements being adapted for connection to external circuit means.

2. In an electronic modular structure, a supporting board of insulating material, and a pair of conductive bus members disposed across said board along one surface thereof, said bus members being anchored to said board in proximity to opposed edges thereof and extending beyond one of said edges to provide protruding terminal elements, said board having a pair of openings therethrough spaced laterally from but in proximity to said bus members and extending from said one surface to the opposite surface thereof in predetermined relation to said bus members, said board being adapted to receive on its said opposite surface an electronic component having a pair of leads capable of extending through said openings for electrical connection, respectively, to said bus members, and said protruding terminal elements being adapted for connection to external circuit means.

3. In an electronic modular structure, an elongated supporting board of insulating material, and a plurality of conductive bus members disposed across said board along one surface thereof in spaced relation to each other and secured to said board at least at points adjacent to the opposed longitudinal edges of said board, said bus members extending beyond one of said edges to provide protruding terminal elements, said board having a plurality of openings therethrough extending from said one surface to the opposite surface thereof and spaced laterally from said bus members, said board being adapted to receive on its said opposite surface a plurality of electronic components each having a pair of leads capable of extending through selected ones of said openings for electrical connection to preselected ones of said bus members, and said protruding terminal elements being adapted for connection to external circuit means.

4. In an electronic modular structure, a supporting board of insulating material, said board having portions thereof removed at transversely spaced, marginal areas thereof, and a conductive bus member disposed on said board across one surface thereof, said bus member having portions extending through said removed board portions to the opposite surface of said board and including anchoring elements in engagement with said opposite surface for securing said bus member to said board, said bus member also having a portion which extends beyond one of said anchoring elements and the adjacent edge of said board to provide a protruding terminal element, and said board also having at least one opening therethrough spaced laterally from said bus member, said board being adapted to receive through said opening from said opposite surface to said one surface thereof a conductive lead for electrical connection to said bus member, and said protruding terminal element being adapted for connection to external circuit means.

5. In an electronic modular structure, a component supporting board of insulating material, said board having a plurality of pairs of transversely aligned, longitudinally spaced portions thereof removed along opposed marginal areas, and a plurality of conductive bus members disposed on said board across one surface thereof, each said bus member having portions extending through a different pair of said removed board portions to the opposite surface of said board and including anchoring elements in engagement with said opposite surface for securing the respective bus members to said board, said bus members each also having a portion which extends beyond one of said anchoring elements thereof and beyond the adjacent edge of said board to provide protruding terminal elements, said board also having a plurality of openings therethrough from said one surface to said opposite surface thereof in laterally spaced relation to said bus members, and said board being adapted to receive on its opposite surface a plurality of electronic components each having a pair of spaced leads capable of extending through selected ones of said openings for electrical connection to predetermined ones of said bus members, and said protruding terminal elements being adapted for connection to external circuit means.

6. An electronic modular structure comprising, in combination, a supporting board of insulating material, a plurality of conductive bus bars affixed to said board over one surface thereof in spaced relation to each other, said bus bars being disposed on said board to extend angularly with respect to the direction of spacing from each other and beyond an edge of said board to provide protruding terminal elements for connection of said structure to external circuit means, said board having a plurality of openings therethrough from said one surface to the opposite surface thereof in laterally spaced relation to said bus bars, and a plurality of electronic components disposed on said opposite surface of said board, said components each having a pair of leads which extend through selected ones of said openings, and the leads of each of said components being respectively connected electrically to selected pairs of siad spaced bus bars.

7. An electronic modular structure comprising, in combination, an elongated supporting board of insulating material, a plurality of conductive bus bars affixed to said board over one surface thereof and in longitudinally spaced relation along said board, said bus bars being disposed transversely to said board and extending beyond one longitudinal edge of said board to provide protruding terminal elements for connection of said structure to external circuit means, said board having a plurality of openings therethrough from said one surface to the opposite surface thereof in laterally spaced relation to said bus bars, and a plurality of electronic components disposed on said opposite surface of said board, said components each having a pair of leads which extend through selected ones of said openings, and the leads of each of said components being resepectively connected electrically to selected pairs of said spaced bus bars.

8. An electronic modular structure comprising, in combination, a supporting board of insulating material, a pair of conductive bus bars mounted on said board along one surface thereof in spaced relation to each other and between opposed edges of said board, each of said bus bars including anchoring means extending through said board and clinched against the opposite surface of said board to thereby secure said bars to said board, said bus bars each having an extension beyond an edge of said board for connection of said bus bars to external circuit means, said board having at least two openings therethrough extending from said one surface to said other surface and respectively in proximity to, but spaced laterally from, said bus bars, and an electronic component disposed on said other surface of said board, said component having a pair of leads which extend respectively through said openings and are respectively electrically connected each to a different one of said bus bars.

References Cited in the file of this patent

UNITED STATES PATENTS

| | | |
|---|---|---|
| 1,514,618 | Ide | Nov. 11, 1924 |
| 2,558,008 | Smith | June 26, 1951 |
| 2,929,965 | Oden | Mar. 22, 1960 |
| 2,958,926 | Morrison | Nov. 5, 1960 |
| 2,963,626 | Du Val et al. | Dec. 6, 1960 |

OTHER REFERENCES

"Interconnections Lag Device Development," published in Electronic Design, November 9, 1960; pages 84–89 relied on.